United States Patent [19]

Kadoch et al.

[11] Patent Number: 5,761,481
[45] Date of Patent: Jun. 2, 1998

[54] SEMICONDUCTOR SIMULATOR TOOL FOR EXPERIMENTAL N-CHANNEL TRANSISTOR MODELING

[75] Inventors: Daniel Kadoch, Austin; Mark I. Gardner, Cedar Creek, both of Tex.

[73] Assignee: Advanced Micro Devices, Inc., Sunnyvale, Calif.

[21] Appl. No.: 434,493

[22] Filed: May 4, 1995

[51] Int. Cl.[6] .............................. G06F 9/455; G06F 17/50
[52] U.S. Cl. .................. 395/500; 364/221.2; 364/232.3; 364/275.6; 364/DIG. 1
[58] Field of Search ........................... 364/578, 488–491, 364/500

[56] References Cited

U.S. PATENT DOCUMENTS

| | | | |
|---|---|---|---|
| 5,446,676 | 8/1995 | Huang et al. | 364/578 |
| 5,467,291 | 11/1995 | Fan et al. | 364/578 |
| 5,481,475 | 1/1996 | Young | 364/491 |
| 5,502,643 | 3/1996 | Fujinaga | 364/488 |

OTHER PUBLICATIONS

Silvaco Product List. Simulation Standard—Announcing: The Virtual Wafer Fab, vol. 3, No. 6, Nov./Dec. 1992, pp. 1–20.

Silvaco Product Literature, Simulation Standard—Announcing: The Virtual Wafer Fab, vol. 3, No. 6, Nov. Dec. 1992, pp. 1–20.

Silvaco Product Literature, Atlas II Device Simulation Framework, undated, 2 pages.

Silvaco Product Literature, SSUPREM4 2-D Process Simulator, undated, 4 pages.

Silvaco Product :Literature, S-PISCES 2-D Silicon Device Simulation, undated, 4 pages.

Primary Examiner—Gary Chin
Assistant Examiner—Ayni Mohamed
Attorney, Agent, or Firm—Merchant, Gould, Smith, Edell, Welter & Schmidt, P.A.

[57] ABSTRACT

A simulator tool for efficiently modeling a semiconductor transistor structure of varying channel lengths. Process simulation of a transistor structure is performed for a half NMOS transistor structure only, followed by separate computations to expand the half-structure to a full structure of varying channel lengths. Standard device simulations are then performed on the full structures to simulate electrical properties of interest, such as threshold voltage ($V_T$) and saturation drive current ($I_{DSAT}$) The tool thereby constructs a virtual model of transistor structure fabrications that can be graphically displayed to correlate process parameters with the electrical properties for use in predicting results in actual manufacturing.

20 Claims, 15 Drawing Sheets

SEMICONDUCTOR SIMULATOR TOOL FOR EXPERIMENTAL N-CHANNEL TRANSISTOR MODELING

TECHNICAL FIELD

The invention relates generally to the field of semiconductor manufacturing and, more particularly, to a method and apparatus for accurately modeling an experimental semiconductor transistor device to optimize the manufacturing process input variables needed to achieve desired electrical properties for the device.

BACKGROUND OF THE INVENTION

Submicron semiconductor manufacturing is complicated by configuration and process constraints that impact the electrical performance of individual devices (e.g., transistors) that make up an integrated circuit (IC) chip. For example, refinement of gate oxide thickness and channel lengths for optimum device performance is essential for manufacturing state-of-the-art ICs. This is complicated by the fact that the implanted channel, lightly doped drain (LDD), and well regions of a device substantially interact with the short channel lengths and ultra-thin gate oxides, thus impacting the final device performance. More generally stated, variable manufacturing process parameters including implant doses and energies, diffusion times and temperatures, and mask layout variations all impact the electrical properties of an IC device and need to be optimized. Electrical properties of interest in defining device performance include, for metal oxide silicon (MOS) technologies as a specific example, threshold voltage ($V_T$), saturation or drive current (IDsat), subthreshold slopes, transconductances, leakage currents and breakdown voltages.

Since circuit densities for a chip typically exceed one million devices, much effort is required to establish the relationships between manufacturing process parameters and the electrical properties of the particular devices in the circuit. Historically, these relationships are determined by running split lots of special test structures in a wafer fab, and then measuring the electrical characteristics of the structures in effort to determine the optimum parameters. This is expensive and very time consuming, even when modern techniques are used to design experiments and perform the required analyses. More recently, semiconductor technology computer-aided design (TCAD) tools have been developed that enable "virtual" wafer fabrication to be performed. These tools, often referred to as simulator tools, enable physically-based process and device simulations for relatively rapid analysis of a given device without the need to actually fabricate matrix lots of silicon structures for the hundreds of various combinations of potential process input variables. Thus a substantial savings in time is achieved, in some cases many months, by using simulator tools to model transistors prior to their actual fabrication. Modeling is preferably accomplished prior to the manufacturing availability of the fab itself, so that when a new fab does come on line it is ready to produce commercially viable IC products.

Modeling of experimental transistor devices using simulator tools also facilitates fabrication of ICs over a full range of scaling of the transistor dimensions. Typical ICs contain several different transistor gate electrode channel lengths, ranging from maximum lengths of 10 microns down to minimum lengths of 0.30 microns or less, the advantage of smaller lengths being improved performance and reductions in the area of silicon required to construct an IC. Accordingly, one use of a simulator tool is to create a model of a transistor having different channel lengths so that the electrical properties for each size of transistor can be determined in advance of actual manufacturing of the IC and set within a specification window acceptable to the customer.

The technology underlying simulator tools has attracted increased attention resulting in substantial refinement thereof. However, despite the significant advances made in this area, commercially available tools suffer certain striking deficiencies. In particular, the computation time required to perform process simulations is significant and can range from 6 to 50 or more hours for each simulation leg of a transistor structure, depending upon how the process parameter matrix and input "decks," i.e., sequence of process or device steps, are defined. When it is desired to construct a model that reflects many variations in channel length, for example, based upon the reasons enumerated above, it becomes impractical to use a simulator tool to run the separate process simulations for the different channel lengths because of the inordinate time required to complete the task.

Therefore, what is needed is a simulator tool with improved efficiency in performing semiconductor transistor structure process simulations, in particular for the modeling of transistor structures of multiple channel lengths.

SUMMARY OF THE INVENTION

The foregoing problems are solved and a technical advance is achieved by method and apparatus for efficiently modeling a semiconductor transistor structure of varying channel lengths. In a departure from the art, the primary process simulation of a transistor structure is performed for a half transistor structure only, followed by separate computations to expand the half structure to a full structure of varying channel lengths. Standard device simulations are then performed on the full structures to simulate electrical properties of interest, such as threshold voltage ($V_T$) and saturation drive current ($I_{DSAT}$).

In a preferred embodiment, a simulator system is provided for modeling a semiconductor transistor structure to optimize fabrication process parameters needed in achieving desired electrical properties for the structure. A process input deck is defined for use in simulating only one half of the structure, process parameter inputs are defined for at least one process parameter of the fabrication process, channel length inputs are defined for the fabrication process, and a device input deck is defined for use in simulating at least one selected electrical property of the structure. A process simulator simulates fabrications of a half-structure of the transistor utilizing the defined process input deck and defined process parameter inputs. A channel length selector then expands the half-structure fabrications to full structure fabrications of prescribed channel lengths utilizing the channel length inputs. A device simulator then simulates at least one electrical property of the full structure fabrications utilizing the defined device input deck. The system thereby constructs a virtual model of the transistor structure fabrications that correlates the process parameters with the desired electrical properties.

A technical advantage achieved with the invention is that it enables a single run of a process simulator to produce simulations of structures of varying channel lengths, as contrasted with requiring separate process simulator runs for each such structure.

Another technical advantage achieved with the invention is that by performing process simulations for half structures only, there is a significant reduction in the computations required to construct a transistor model.

Another technical advantage achieved with the invention is the time saved in performing transistor modeling, both in terms of engineering time needed to set up the model and in computation time required for the model calculations, thereby enabling much more complex models to be constructed.

DESCRIPTION OF THE PREFERRED EMBODIMENTS

Figure 1:
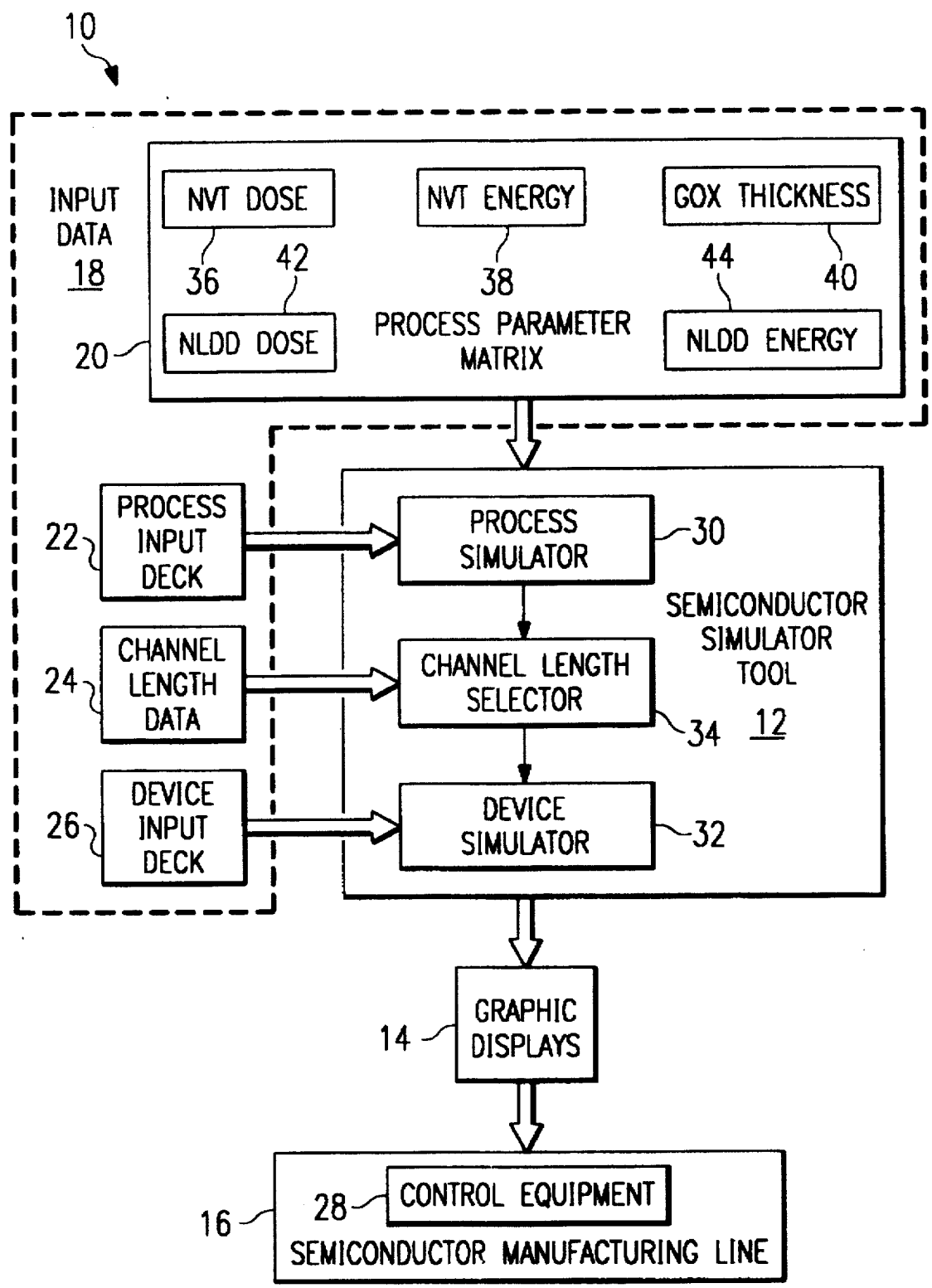
FIG. 1 is a schematic block diagram of the simulator system of the present invention.

In FIG. 1 the reference numeral 10 refers to a simulator system of the present invention for experimentally modeling a semiconductor device such as a transistor (not shown). The system 10 comprises a simulator tool 12 that produces graphic displays 14 used in the definition of process parameters and future scaling of transistors in a semiconductor manufacturing line 16. Input data 18 for the tool 12 includes a process parameter matrix 20, a process input deck 22, a device input deck 24 and channel length data 26. The input data 18 are defined for the model, received in the simulator tool 12 and processed as described in detail below. The resulting displays 14 enable visualization of a comprehensive model with all possible interactions of process input variables being accounted for in defining the electrical properties of transistor devices of interest. Control equipment 28 in the line 16 is then set to manufacture ICs according to process parameters that are optimized for the transistors modeled by the tool 12.

The tool 12 provides a computing environment for performing and analyzing the virtual process and device experiments. While not shown, the tool 12 is embodied as a computer that includes a processor, memory, input/output (I/O) devices and software for performing both the unique modeling functions of the present invention as well as conventional statistical data analysis and virtual wafer fabrication functions. A software platform for the tool 12, in the preferred embodiment, is commercially available from Silvaco International, of Santa Clara, Calif. under the trade name Virtual Wafer Fab™. Suitable hardware includes a SUN Sparc, HP 700 Series, IBM RS 6000 series, DEC Ultrix 3100, 5000 series or other comparable, commercially available workstation. It is understood that the input data 18 is defined and received in the memory of the tool 12 and is stored in appropriate data structures for later processing in accordance with features of the present invention.

A process simulator 30, a device simulator 32, and a channel length selector 34 are included as software running on the tool 12 for performing the unique transistor modeling functions described in detail below. The process simulator 30 and the device simulator 32 are commercially available applications and, in the preferred embodiment, are also manufactured by Silvaco International, of Santa Clara, Calif. under the trade names SSUPREM4™, and S-PISCES™, respectively. The channel length selector 34, however, is not commercially available and represents a modification of the tool 12 for performing the unique MOS transistor modeling functions of the present invention.

The process parameter matrix 20 includes the parameters of N-channel threshold voltage adjust implant (NVT) dose 36, NVT energy 38, gate oxide thickness 40, N-channel lightly-doped drain implant (NLDD) dose 42, and NLDD energy 44. These parameters describe the experimental construct of a transistor and are established based upon previous engineering knowledge. It is understood that variations in these parameters determine the electrical characteristics of a transistor and, as described in detail below, are essential to the formulation of a transistor model wherein electrical properties of transistors can be predicted based upon changes in the parameters. It is also understood that additional or different parameters may be utilized to describe different experimental constructs.

The process input deck 22 defines a sequence of fabrication process steps necessary for constructing a transistor. In the present embodiment, several process steps are of interest. These process steps are well known in the industry and include, as examples, growing the oxide; implanting the channel doping; removing oxide; growing gate oxide; depositing polysilicon; masking channel lengths; etching polysilicon; implanting NLLD; depositing and etching back spacer oxide; and performing polyoxidation and N+implant. The processes are performed "virtually" by the system 10 to simulate the construction of an experimental negative channel (n-channel) transistor.

Figure 2A:
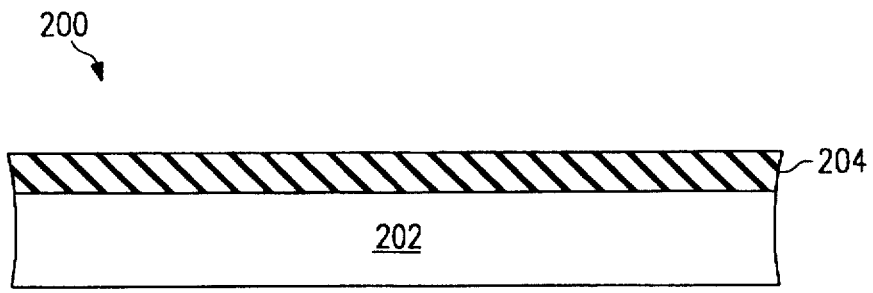
FIGS. 2a–2d are schematic illustrations of a semiconductor structure in cross-section, showing the process flow for construction of the n-channel region as defined by a process input deck of the system of FIG. 1.

FIGS. 2a–2d illustrate schematically the sequence of fabrication steps defined by the process input deck 22 for constructing a transistor structure 200 (shown in cross-section). In FIG. 2a, the process of growing the gate oxide is illustrated for the structure 200 wherein a silicon substrate 202 is provided with a 250 angstrom oxide layer 204. This is typically the first step in the process modeling sequence of the positive well (p-well) or negative channel (n-channel) region. The oxide is often referred to as a sacrificial oxide ("sac oxide") since it will be removed following the completion of the implant. If isolation is used, this oxidation is referred to as Kooi oxidation, after the inventor of the localized oxidation of silicon (LOCOS) process, since it enhances the oxide quality at the field oxide/source drain edge of the transistor. For the process flow of the present embodiment, the 250 angstrom growth of the oxide layer 204 acts as both the Kooi oxidation and implant $V_T$ oxide.

Figure 2B:
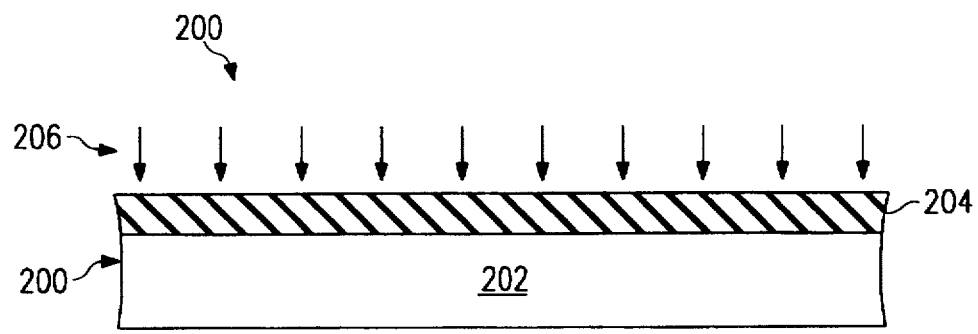

FIG. 2b illustrates the process of implanting channel doping in the structure 200. The implanting is represented schematically by arrows 206. For this process step both the energy and dose (in units of ions/cm$^2$) are varied in the modeling to provide for optimum distribution of dopant atoms for the channel region of the semiconductor structure 200. This implant is critical to establishing the electrical properties of the transistor defined by the structure 200, for example, threshold voltage ($V_T$), and drive current ($I_{DSAT}$).

Figure 2C:
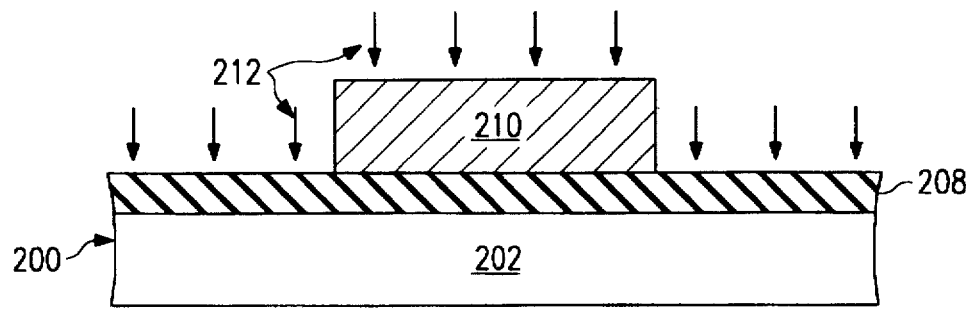

FIG. 2c illustrates the process of removing implant oxide, growing gate oxide, depositing polysilicon, depositing the polysilicon mask, performing polysilicon etch, and performing NLDD implant. Following the completion of implanting channel doping into the structure 200, the 250 angstrom Kooi oxide is removed using a 10:1 HF solution for 1.5 minutes. Next, the gate oxide 208 is grown at values of around 70 angstroms, 80 angstroms or 90 angstroms. It should be appreciated that this gate oxide thickness is contained in both the threshold voltage equation and drive current equation and is a key process parameter in the simulation performed by the system 10. Since the gate oxide 208 must have very reliable oxide properties the channel implant is not usually performed through this oxide, but instead is performed prior to gate oxide growth. Next, polysilicon 210 is deposited at a thickness of 3000 angstroms over the entire surface of the structure 200. Transistors are then patterned using an i-line photolithography process followed by etching in a plasma etch system to define transistor lengths of polysilicon of 0.35, 0.40, 0.45, 0.50, and 0.75 micrometers. After the poly etch is completed the entire p-well region is implanted with phosphorous, as indicated by arrows 212. The contemplated modeling technique varies the implanted dose and energy of this implant. This implant, also referred to as the lightly diffused drain (LDD) implant, should be implemented prior to spacer oxide depositons. It is understood the phosporous dopant goes into the LDD, source/drain (S/D) regions of the structure 200, as well as in the polysilicon regions.

Figure 2D:
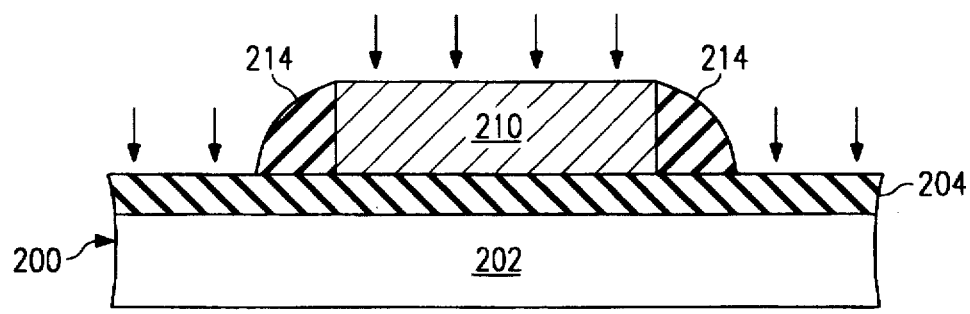

FIG. 2d illustrates the deposition of spacer oxide, spacer etch, polysilicon oxidation and N+ implant. A deposition of spacer oxide is performed by first depositing the spacer oxide over the entire structure 200, followed by using an anisotropic etch whereby the spacer oxide region 214 is formed. Next an arsenic implant is performed, as indicated by arrows 216, that implants heavily doped Arsenic dopant atoms in both the polysilicon and S/D regions. The role of the spacer oxide is to keep the heavily doped atoms away from the edge of the polysilicon gate electrode. Thus the thickness of the spacer oxide is also key to how close the high dose arsenic implant (e.g., typically greater than 2 θ15 ions/cm$^2$) should be from the gate electrode edge. Proper control of the dopant profile at the profile edge thus enables creation of high performance transistors that are reliable. Usually, a short anneal using RTA or diffusion tube is also performed at this time to activate the dopant atoms.

Figure 3A:
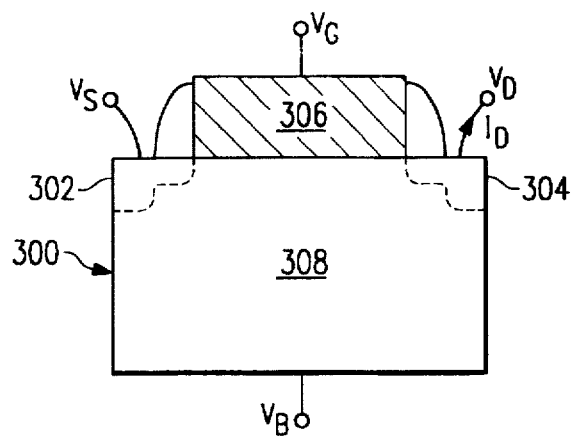
FIGS. 3a and 3b are a schematic illustration of a transistor structure in cross-section, and a graphical representation for determining threshold voltage ($V_T$), respectively, for explaining the electrical test descriptions of transistors as defined by a device input deck of the system of FIG. 1.
Figure 3B:
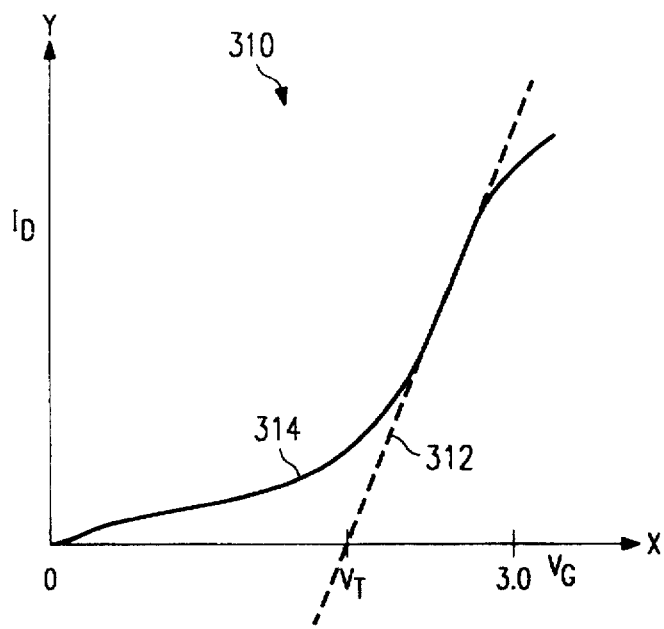

FIGS. 3a and 3b schematically illustrate the electrical test descriptions of transistors as defined by the device input deck 26 (FIG. 1). The device input deck 26 comprises a first input deck for threshold voltage ($V_T$) extractions, and a second input deck for extractions of drive, i.e., saturation, current ($I_{DSAT}$). In FIG. 3a there is shown a structure 300 representing a transistor having four voltages $V_S$, $V_G$, $V_D$, $V_B$ applied as shown to the source 302, gate 304, drain 306 and bulk 308 of the structure, respectively. First, the voltages are set as follows: $V_S$=0, $V_B$=0, $V_D$=+0.1 volts. Then, $V_G$ is ramped from 0V to +3V, while the drain current ($I_D$) is calculated. FIG. 3b illustrates a graph 310 showing how $V_T$ is determined. The x-intercept of a line 312 represents $V_T$. The line 312 is tangent to the maximum slope of a curve 314 plotting $I_D$ versus $V_G$.

Also with reference to FIG. 3a, from the same transistor structure 300 the second input deck is defined to extract $I_{DSAT}$. First, the four voltages are set as follows: $V_S$=0, $V_B$=0, $V_G$=+3.3, $V_D$=+3.3 volts. Then $I_D$ is calculated such that its value is $I_{DSAT}$.

Figure 4:
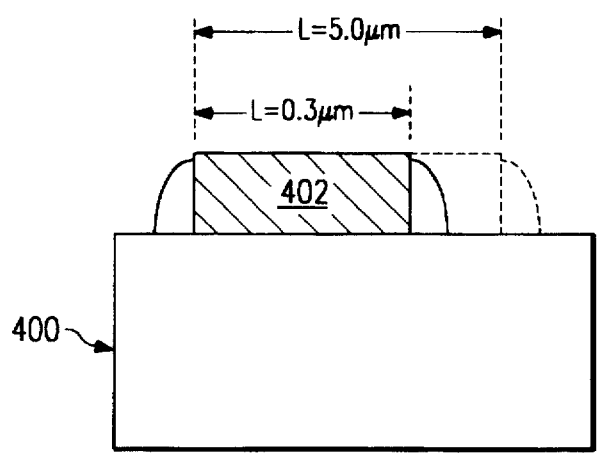
FIG. 4 is a schematic illustration of a transistor structure in cross-section showing variations in channel length that define channel length data in the system of FIG. 1.

FIG. 4 illustrates a transistor structure 400 and shows the channel length (L) that is varied to define the channel length data 24. The length L of the channel, formed by polysilicon 402 on the structure 400, is varied incrementally from a range of about 0.3 to 5.0 microns for a typical model.

Figure 5:
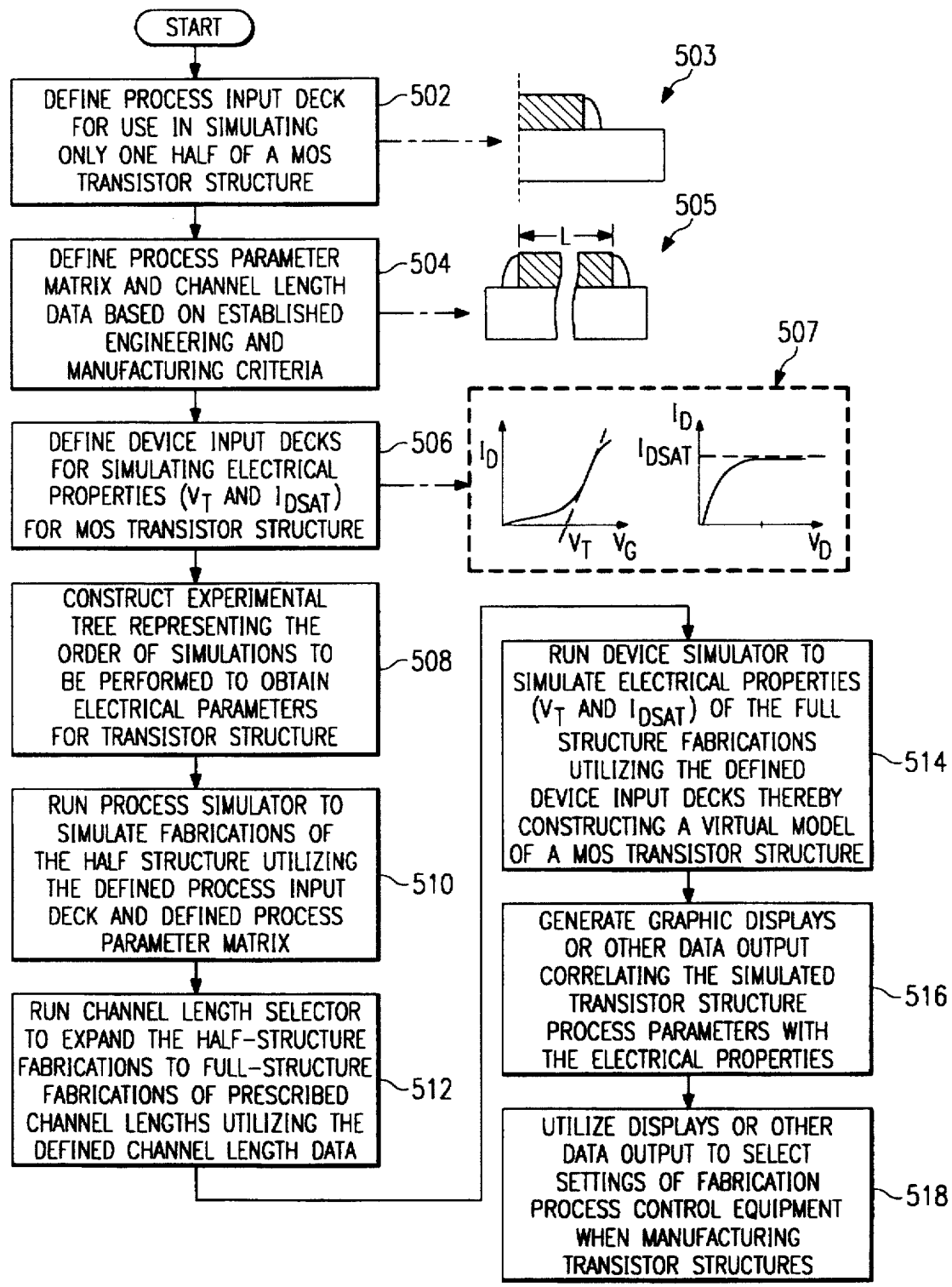
FIG. 5 is a flow chart of the operation of the system of FIG. 1.

FIG. 5 is a flowchart illustrating operation of the system 10. In operation, the system 10 is used to set up, run and analyze a virtual transistor experiment, the final output of which can be used to define parameters for semiconductor manufacturing on the line 16.

In step 502 the process input deck 22 is defined so that when it is executed by the process simulator 30 a half structure of a MOS transistor is generated. For clarity, such a half-structure is schematically illustrated in the flowchart and referred to by the numeral 503. Defining the deck 22 entails entering data representing the process flow shown in FIG. 2a-2d, but limited to that for a half-structure. In step 504, the matrix 20 and channel length data 24 are defined based upon established engineering and manufacturing criteria. A structure 505 illustrates exemplary dimensions thereby defined. In step 506, the two decks of device input deck 26 are defined to extract $V_T$ and $I_{DSAT}$ from a full MOS transistor structure, similar to that illustrated in FIG. 3a. The graphs 507 illustrate the curves plotting $I_D$ versus $V_G$, and $I_D$ versus $V_D$, from which $V_T$ and $I_{DSAT}$ are respectively extracted. In step 508 the defined data comprising the process input deck 22, the device input decks 26, matrix 20 and channel lengths 24 are received in the tool 12 and stored in memory. The received data is then utilized by the tool 12 to construct an experimental process flow or "tree" representing the order of simulations to be performed to obtain the electrical parameters for transistor structures.

Figure 6:
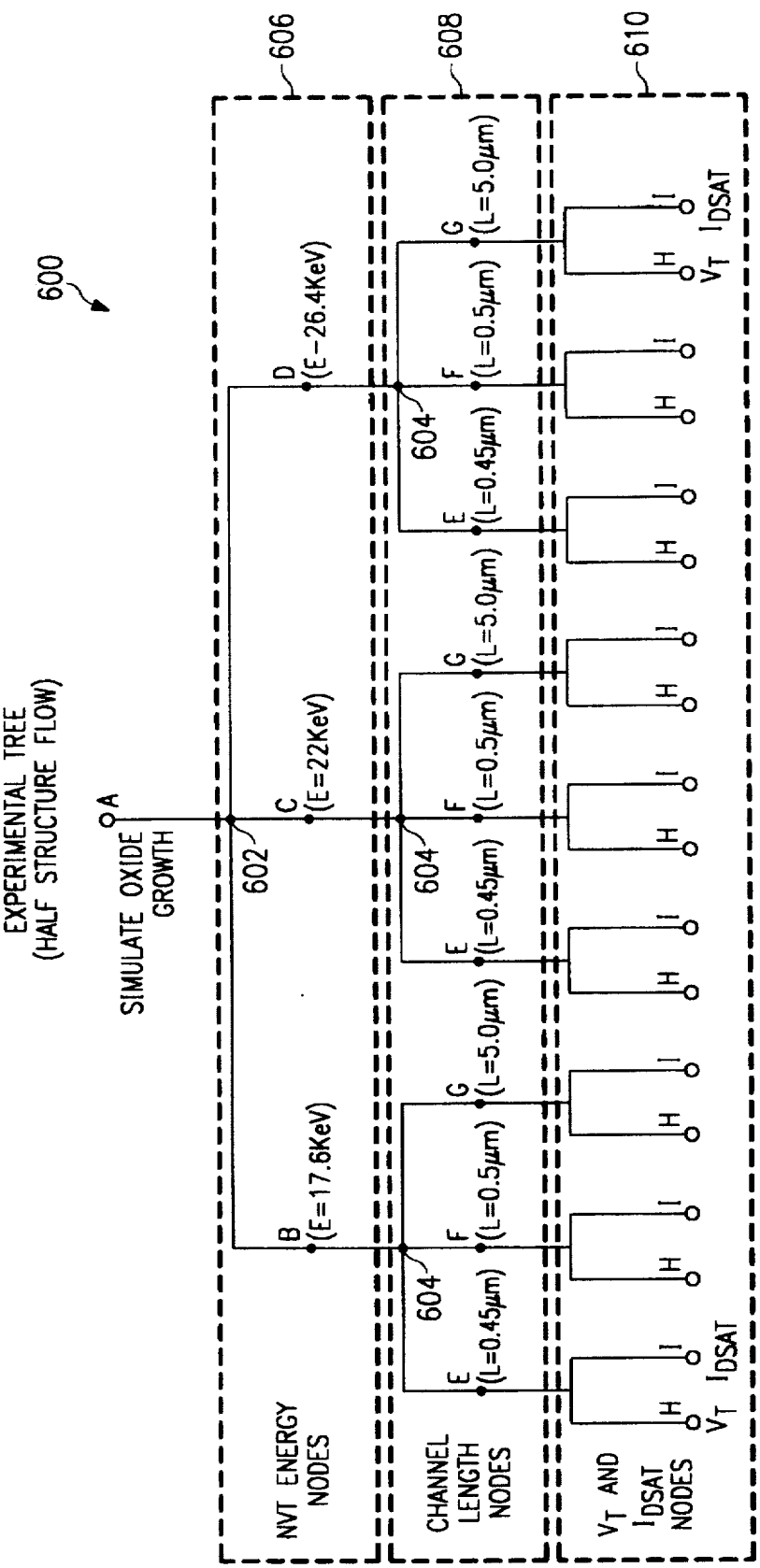
FIG. 6 is a schematic illustration of an experimental tree for a half structure process flow constructed by the system of FIG. 1.

Referring also to FIG. 6, an experimental tree 600 is illustrated as constructed by the tool 12 in step 508. The tool 12 constructs the tree 600 to establish experimental "split points" that represent the alternative values given to each input parameter of the matrix 20 and the channel length data 24 for processing. For example, a first node A represents a simulation of the oxide growth process defined by the input deck 22. Subsequently, a split point 602 is shown to indicate there will be three different process simulation nodes B, C, D representing runs of the oxide growth process for three different values of $NV_T$ energy; for example, 17.6 KeV, 22 KeV and 26.4 KeV. While not shown, it is understood that split points for every process parameter of the matrix 20 are defined by the tree 600 and are executed in the process simulator 30. For the sake of simplicity in illustration, only the $NV_T$ energy process parameter split point 602 is illustrated. For each separate process flow or "leg" following nodes B, C, D, a split point 604 is provided representing different values for channel length (L). The different channel length values are defined by channel length data 24; for example, 0.45, 0.5 and 5.0 microns. Split point 604 results in nodes E, F, G. These nodes are executed by the channel length selector 34, as will be described in detail below. Finally, the last two nodes H, I of each leg following nodes E, F, G represent those executed by the device simulator 32 to extract the two target electrical parameters, $V_T$ and $I_{DSAT}$. As explained below, processing executed in the system 10 according the defined experimental tree 600 is performed by the process simulator 30, channel length selector 34 and device simulator 32 for the respective legs of the tree indicated by the respective dashed boxes 606, 608 and 610.

Referring again to FIG. 5, once the experimental tree 600 is constructed operation proceeds to step 510. In step 510, the tool 12 runs the process simulator 30 to simulate fabrications of the transistor half-structure utilizing the defined process input deck 22 and the defined process parameter matrix 20. In step 512, the half-structure simulation output of the process simulator 30 is then acted upon by the channel length selector 34. The tool 12 runs the channel length selector 34 to expand the simulated half-structure fabrications to full structure fabrications. The full structure fabrications are of prescribed channel lengths as defined by the channel length data 24.

Figure 7:
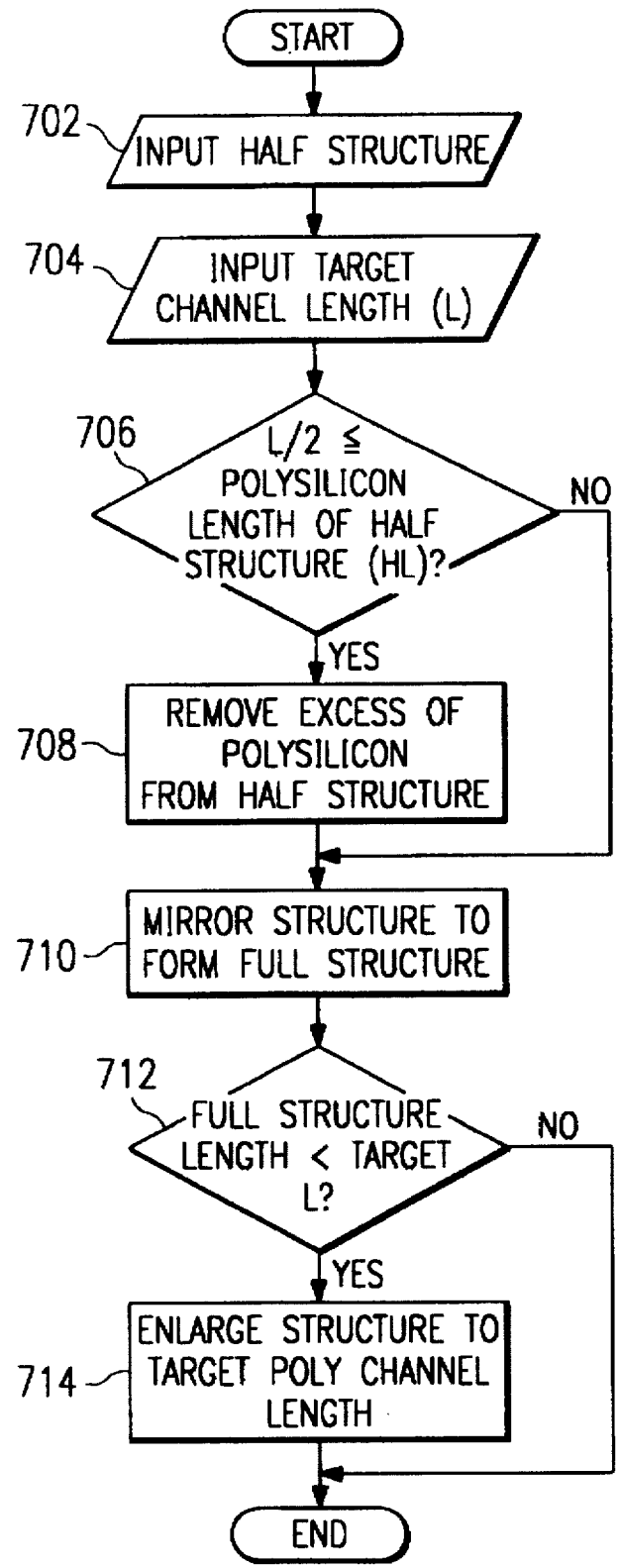
FIG. 7 is a flow chart of the operation of the channel length selector of the system of FIG. 1.

FIG. 7 illustrates a flowchart of the operation of the channel length selector 34 in further explanation of step 512. The channel length selector 34 is implemented as an input deck to the process simulator 30. In step 702 the simulation half-structure generated by the process simulator 30 is input to the channel length selector. In step 704 a prescribed, or "target" channel length (L) is input from the channel length data 24 to the channel length selector 34. In step 706 a determination is made whether the target channel length divided by two (L/2) is less than the length of the polysilicon of the half-structure (HL). If so, execution proceeds to step 708. In step 708, the excess of the polysilicon on half-structure is removed. Otherwise, execution proceeds directly to step 710. In step 710, the half-structure is mirrored to form a full structure. In step 712, a determination is made whether the length of the polysilicon in the full structure is less than the target length (L). If so, execution proceeds to step 714 wherein the polysilicon of the structure is enlarged such that its polysilicon length becomes the target channel length (L). If not, execution is terminated.

In processing the decision logic of the channel length selector 34, it is recognized that commercially available process simulators, such as simulator 30, typically do not support decision-based, i.e., IF/THEN programming statements. Accordingly, by mathematical equations the equivalent of a decision making process is realized for performing steps 606, 608 and 612, 614. The following source code illustrates the details for steps 606 and 608:

10 TEMP =(L/2) –HL
20 TEMP1=(TEMP/abs (TEMP)–1)/2)
30 TEMP2=TEMP1*abs(TEMP)
40 etch left p1.x=TEMP2

In line 10, TEMP represents a variable defining how much of the transistor structure to etch, defined in terms of half of the target length (L/2) minus the half length of the structure (HL). In line 20, TEMP1 represents a variable of whether to shorten (i.e., remove the excess of) the structure or not. The value of TEMP1 will be either 0 or 1, with it being 0 if no shortening is to occur, and 1 if shortening is to occur. In line 30 TEMP2 represents a variable that defines the amount of the structure to be subsequently etched (i.e., establishing the channel length) in line 40. Its value will be either 0 or the excess amount to remove. Line 40 is a command for removing the amount prescribed by TEMP2.

It is appreciated that the principle of the foregoing source code can likewise be applied to the execution of the decisions required of steps 612 and 614. The result of the foregoing is the generation of a full structure of the prescribed target channel length.

Continuing in operation of the system 10 with reference to FIG. 5, following the expansion of the half-structure to a full structure of prescribed channel lengths in step 512, execution proceeds to step 514. In step 514 the device simulator 32 is run in the tool 12 to simulate the electrical properties ($V_T$ and $I_{DSAT}$) of the full structure fabrications utilizing the defined device input deck 26. The result is the construction of a virtual model of transistor full structure fabrications. The model accurately correlates the fabrication process parameters with the resulting electrical properties of the transistor structures.

In step 516 graphic displays 14 (FIG. 1) or other data is output from the tool 12 to show the correlation of the simulated transistor structure process parameters with the prescribed electrical properties. In step 518 the graphic displays or other output are interpreted by an engineer and used to select settings of process control equipment 28 (FIG. 1), such as an implanter, in the actual manufacture of ICs containing transistor structures modeled in the tool 12.

Figure 8:
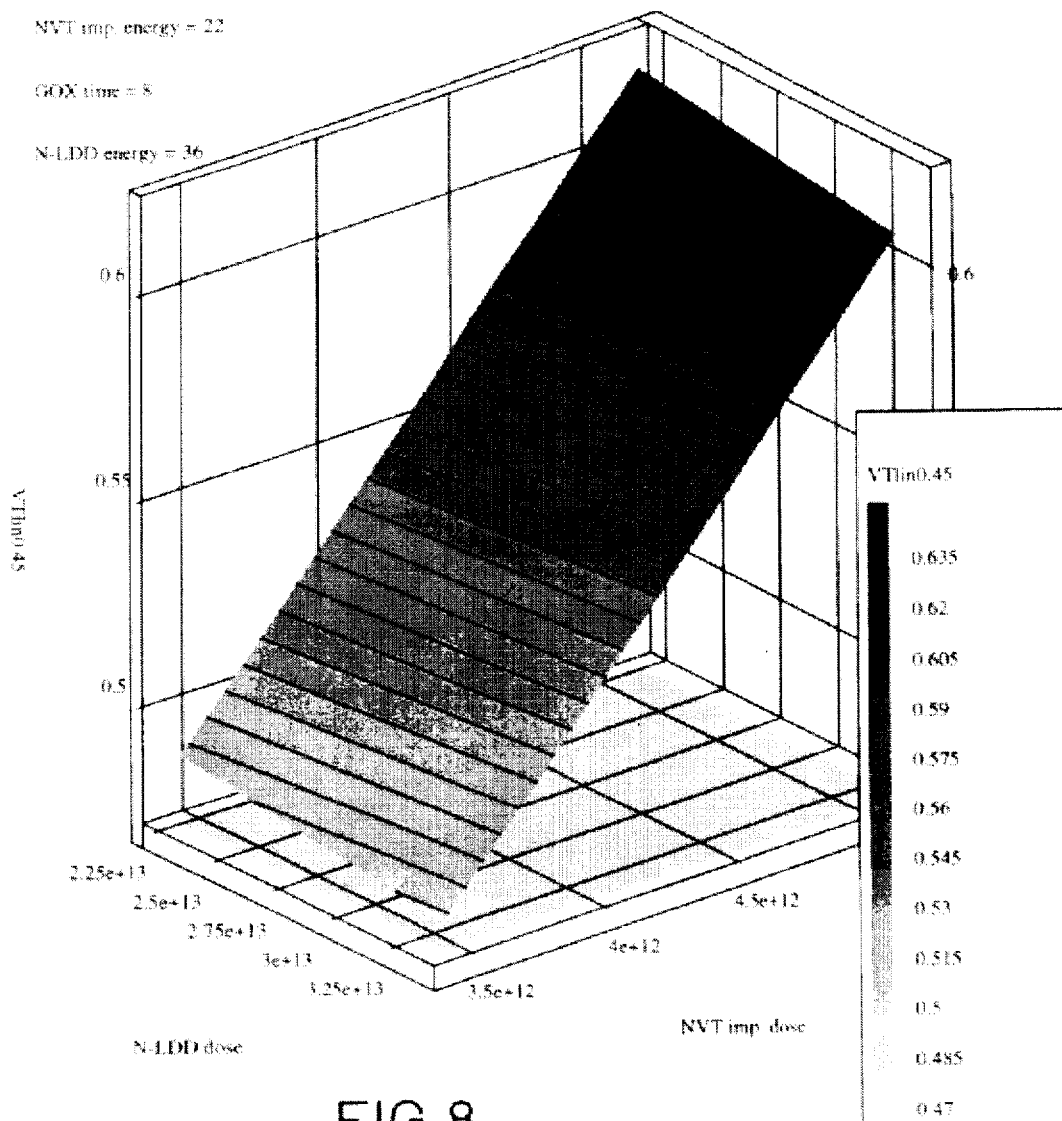
FIGS. 8–15 are graphic displays generated by the system of FIG. 1 illustrating three-dimensional plots of output electrical properties ($V_T$ or $I_{DSAT}$) for different channel lengths versus certain process parameter input variables.

FIGS. 8–15 illustrate examples of graphic displays 14 output from the tool 12 in accordance with the present invention. In FIG. 8, there is illustrated a threedimensional graph plotting the output electrical property variable of threshold voltage ($V_T$), for a channel length of L=0.45 um, versus process parameter variables NLDD dose and NVT dose. The plot produces a surface correlating how $V_T$ changes, for a given channel length L (in this case 0.45 um), as the NLDD dose and NVT dose are changed. Accompanying the three dimensional plot in FIG. 8 there is also a shading or color gradient representing the different values of $V_T$ corresponding to the surface generated, for the convenience of the engineer interpreting the graph.

Figure 9:
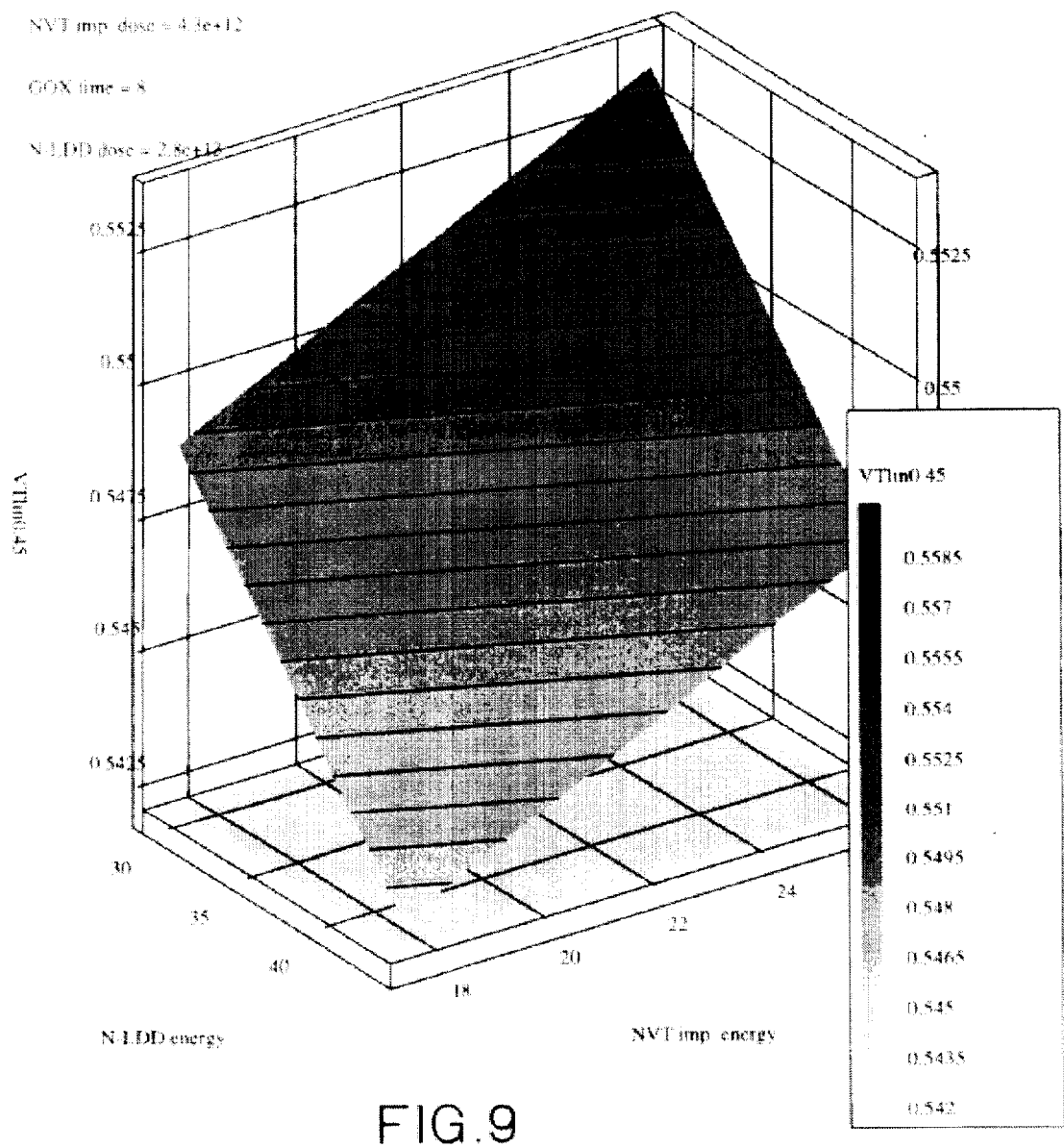
Figure 10:
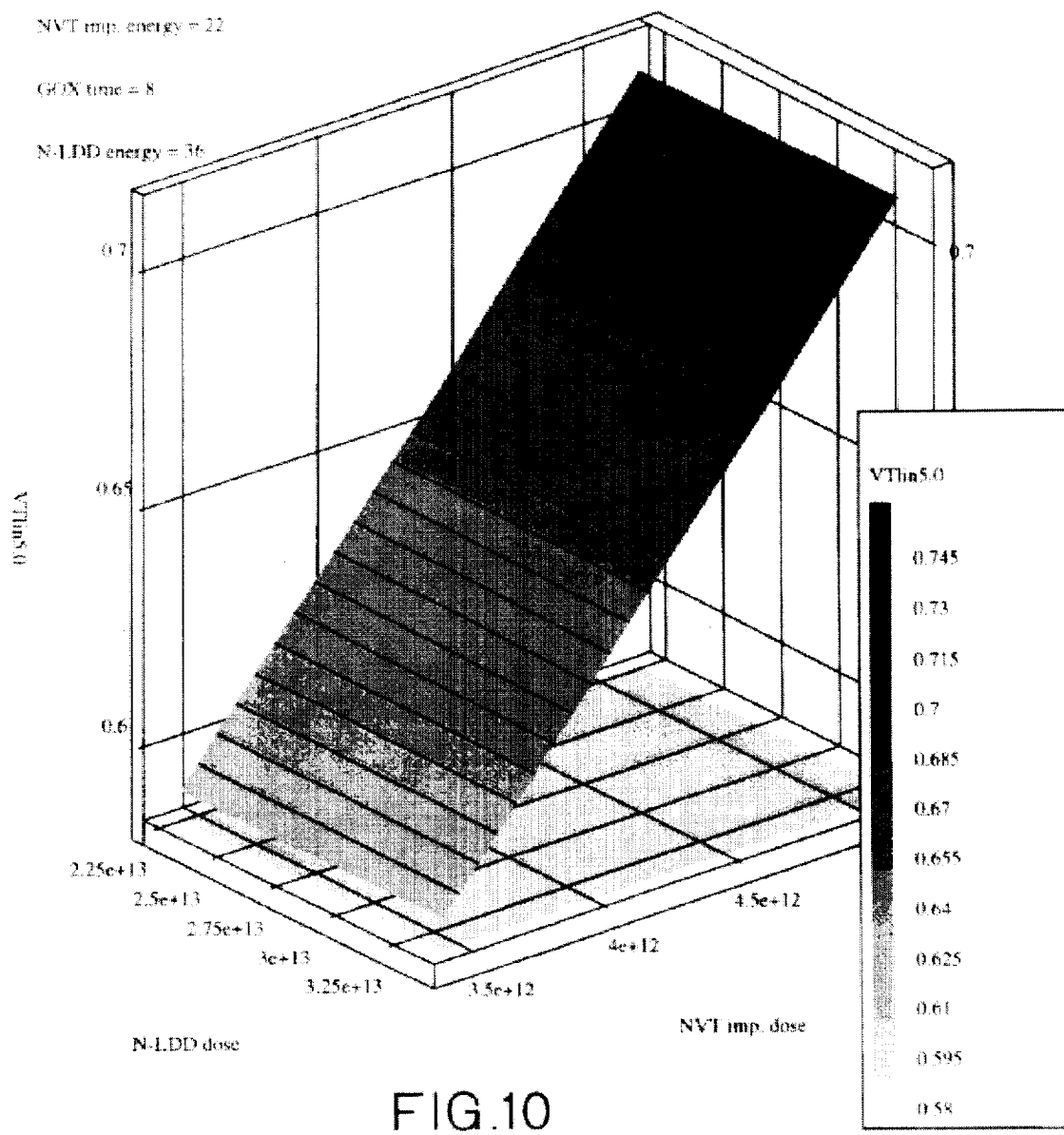
Figure 11:
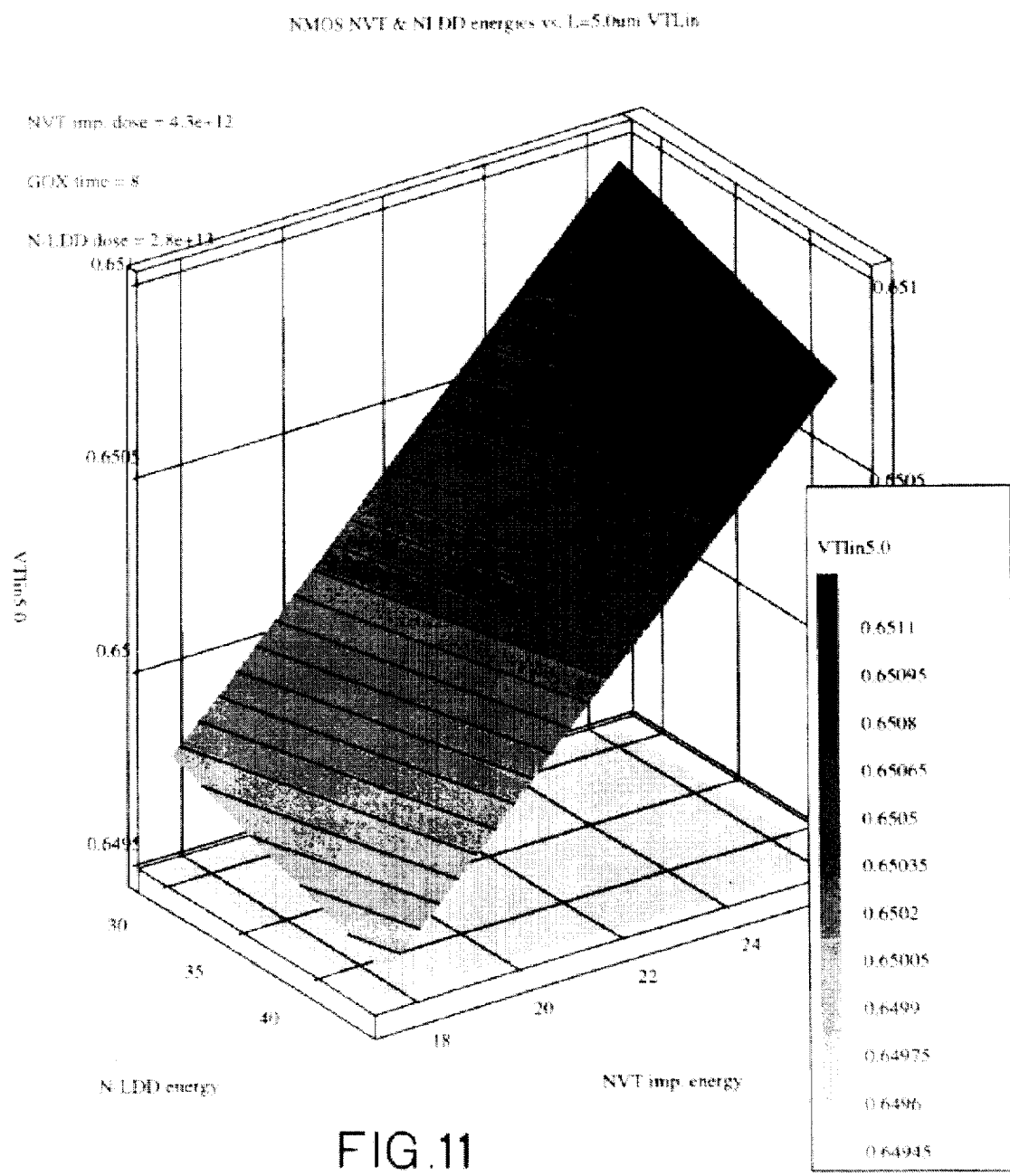
Figure 12:
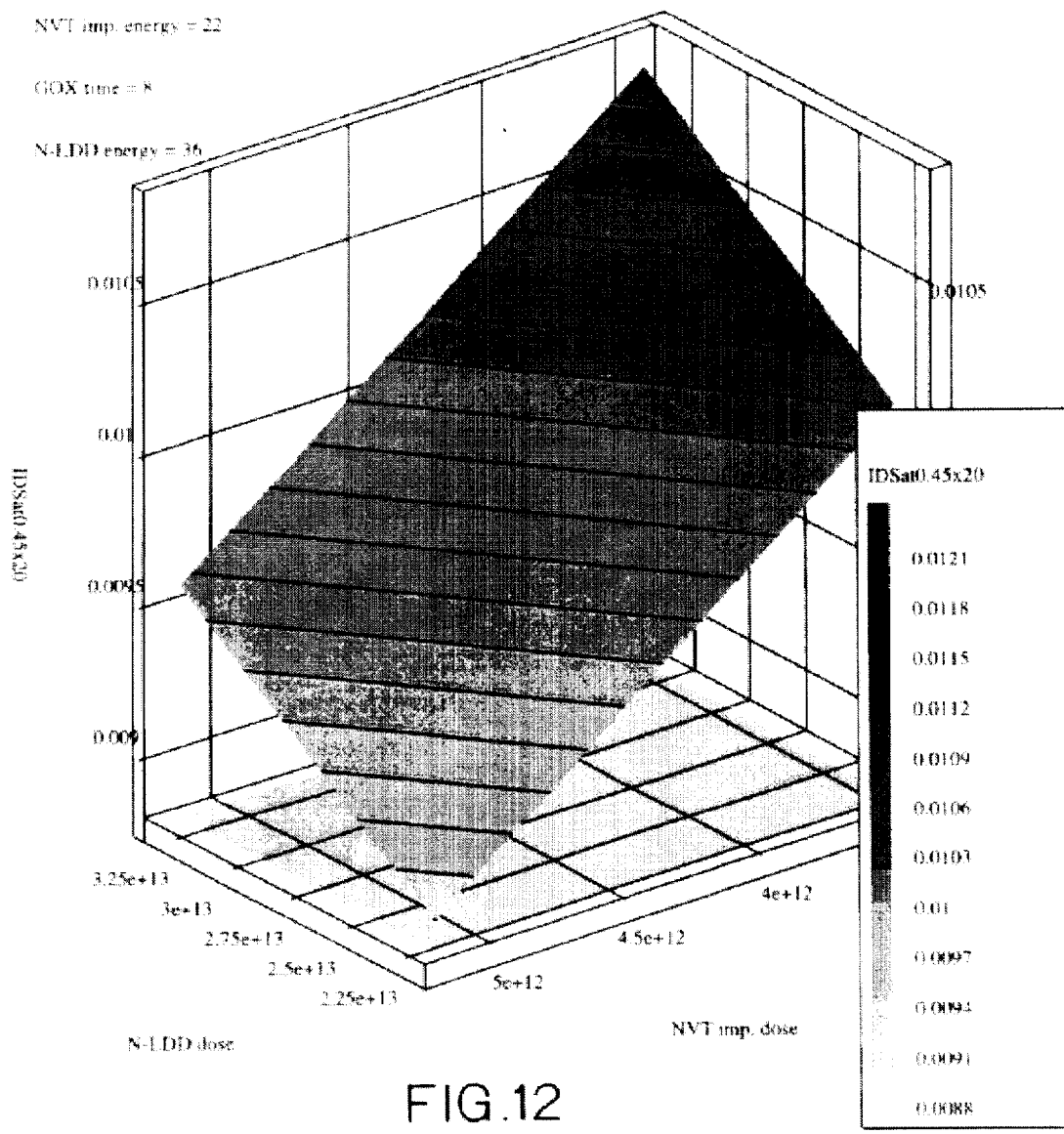
Figure 13:
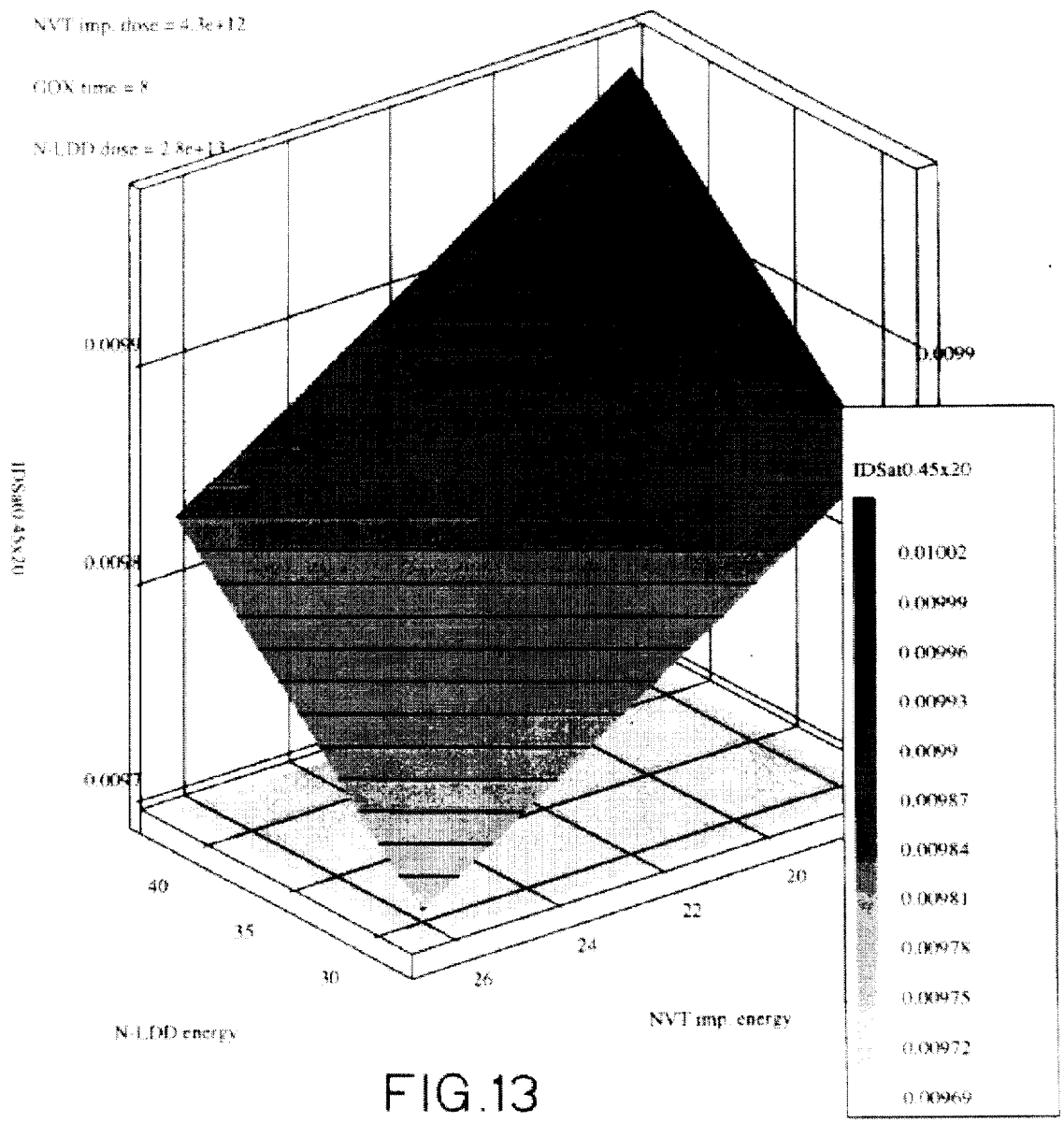
Figure 14:
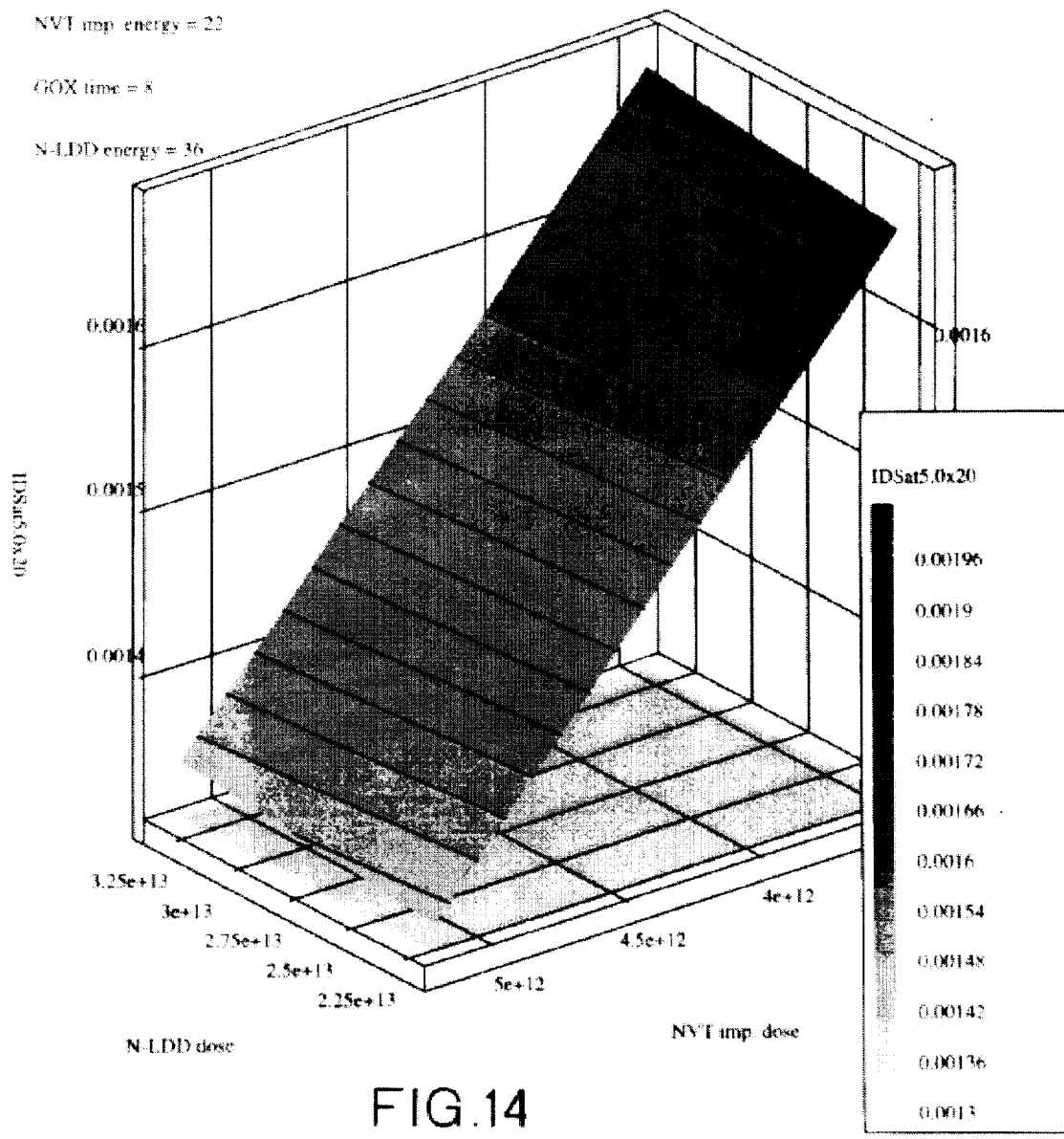
Figure 15:
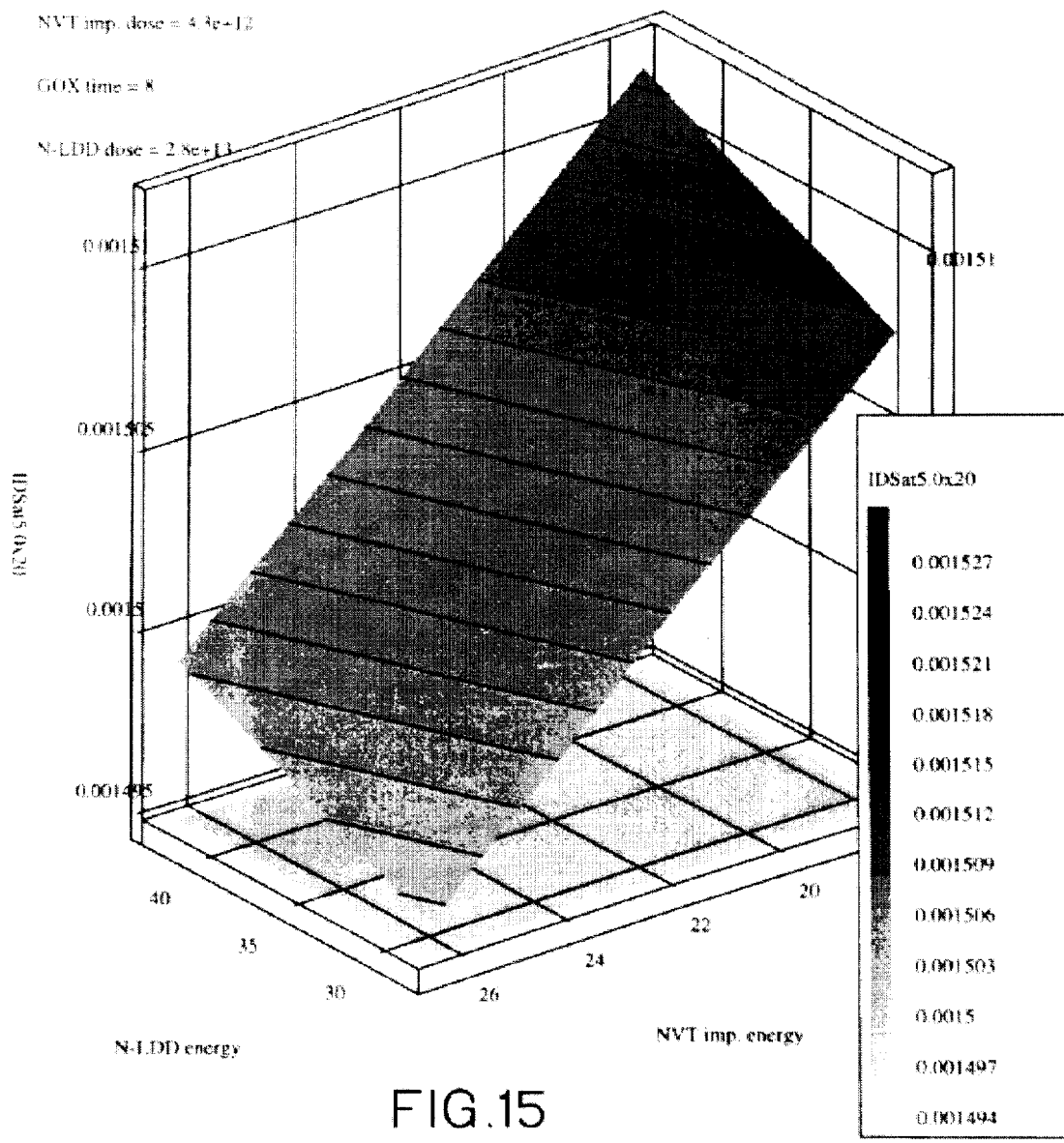

FIGS. 9–11 illustrate variations of the same type graph plotting $V_T$ for different channel lengths L versus the various process parameter variables, including NLDD energy. FIGS. 12–15 illustrate variations of the same type graph plotting saturation current ($I_{DSAT}$) for different channel lengths versus various process parameter variables.

The foregoing graphical displays are utilized by semiconductor engineers to optimize the selection of process parameters in fabricating transistors. For example, in selecting the appropriate two doses and two energies to "dial into" process control equipment 28 such as an implanter, it is desired that the $V_T$ values for all channel lengths be within an allowed range. Also, $I_{DSAT}$ should be as hig as possible, since more drive current translates into faster circuits and hence faster chips. Since any particular dose and energy change may have its drawbacks, e.g., lower $I_{DSAT}$, and/or $V_T$ out of range, engineering judgment is used, based upon the displayed data, to determine the final process parameter choices. For example, the engineer looking at one of the foregoing graphs would pick a point on the surface and thereby determine what dose or energy input variables would produce the $I_{DSAT}$ or $V_T$ values attempting to be achieved.

Figure 16:
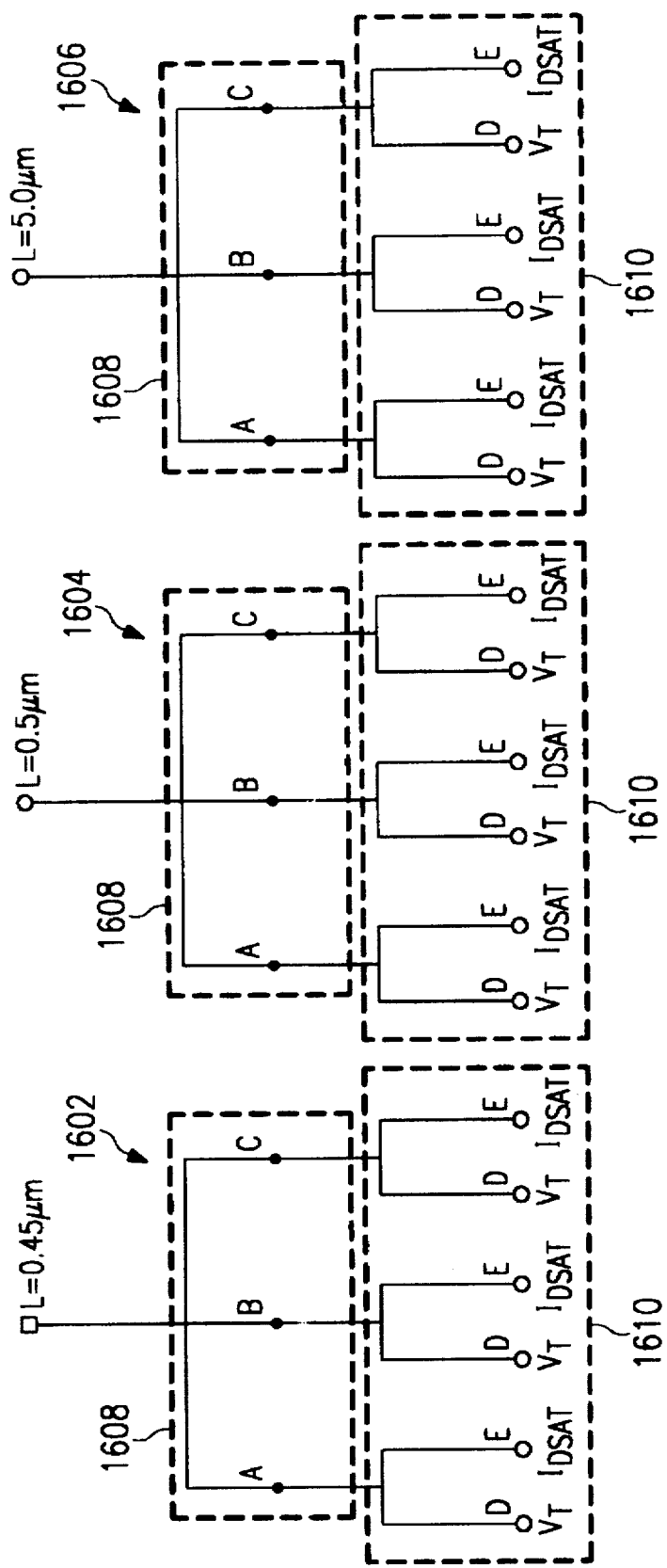
FIG. 16 is a schematic illustration of a prior art experimental tree for a full structure process flow.

FIG. 16 illustrates operation of a prior art simulator tool for performing transistor modeling to obtain the same $V_T$ and $I_{DSAT}$ data without the benefit of the present invention. Without the benefit of the channel selector 34, the conventional tool would have to construct three separate full structure experimental trees 1602, 1604, and 1606 for execution by the process simulator 30, one for each of the three prescribed (0.45 um, 0.5 um, 5.0 um) channel lengths. Dashed-line boxes 1608 represent the three separate runs of the process simulator 30 for the process parameter nodes A, B, C. Each run would entail the same process parameter matrix 20 and device input decks 26, as defined by nodes D, E for generating $V_T$ and $I_{DSAT}$, but would require different process input decks 22 tailored to produce full structures of 0.45 um, 0.5 um, and 5.0 um channel lengths. Aside from taking more engineering time to set up and later collect data for the three separate process simulator 12 runs, a major drawback of this approach is the significantly longer computational time required of the process simulator 12. In contrast to the present invention that simulates each leg of a half-structure in roughly four hours, for a total of twelve hours for three legs, the prior art simulation of each leg of a full 0.45 um structure takes about 6 hours, each leg of a full 0.5 um structure takes about 6.5 hours, and each leg of a full 5.0 um structure takes about 33 hours, for a total of 136.5 hours. The channel length selector 34 of the present invention takes about 45 minutes for its nine legs. The device simulator 32 would take the same 6 hours in both the case of the present invention and the prior art. Thus total simulation time for the present invention would be about 12+ (0.75×6)=18.75 hours, whereas for the prior art system it would be 136.5+6=142.5 hours. This is 760% longer for the same simple one-process parameter simulation. In a more complex 5-parameter matrix 20 and 5 channel lengths of interest, a tremendously greater time savings is achieved. Thus it would be impractical to perform this type of simulation without the present channel length selector of the present invention.

It is understood that the present invention can take many forms and embodiments. The embodiments shown herein are intended to illustrate rather than to limit the invention, it being appreciated that variations may be made without departing from the spirit of the scope of the invention. For example, it is contemplated that different or additional process parameters may comprise the matrix 20, and that the process input deck and device input decks may be defined differently. Any number of channel lengths or other variables may be utilized. The graphic displays generated by the system would differ accordingly. Other forms of data output are likewise contemplated. The concepts of the present invention can be applied to model different types of semiconductor devices.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A method for modeling a semiconductor transistor structure to optimize fabrication process parameters needed in achieving desired electrical properties for said structure, the method comprising:

defining a half-structure of said semiconductor transistor;

defining a fabrication process input deck for use in simulating only said half-structure;

defining process parameter inputs for at least one process parameter of said fabrication process;

defining channel length inputs for said fabrication process;

defining a device input deck for use in simulating at least one electrical property of said structure;

simulating fabrications of said half-structure utilizing said defined process input deck and defined process parameter inputs;

expanding in separate computations said half-structure fabrications to full structure fabrications of prescribed channel lengths utilizing said channel length inputs; and simulating said at least one electrical property of said full structure fabrications utilizing said defined device input deck, thereby constructing a model of said transistor structure fabrications that correlates said process parameters with said at least one electrical property.

2. The method of claim 1 further comprising generating an output of said model.

3. The method of claim 2 wherein said output comprises a graphical display.

4. The method of claim 3 wherein said graphical display comprises a three dimensional plot of said at least one electrical property for a selected one of said prescribed channel lengths versus two selected ones of said process parameter inputs.

5. The method of claim 1 further comprising setting process control equipment in a semiconductor manufacturing line responsive to said model to thereby fabricate said transistor structures according to said correlated process parameters and at least one electrical property.

6. A method for modeling a semiconductor transistor structure to optimize fabrication process parameters needed in achieving desired electrical properties for said structure, the method comprising:

defining a fabrication process input deck for use in simulating only one half of said structure;

defining process parameter inputs for at least one process parameter of said fabrication process;

defining channel length inputs for said fabrication process;

defining a device input deck for use in simulating at least one electrical property of said structure;

simulating fabrications of said half-structure utilizing said defined process input deck and defined process parameter inputs;

expanding said half-structure fabrications to full structure fabrications of prescribed channel lengths utilizing said channel length inputs; and simulating said at least one electrical property of said full structure fabrications utilizing said defined device input deck, thereby constructing a model of said transistor structure fabrications that correlates said process parameters with said at least one electrical property wherein said expanding of said half-structure fabrications, for each said half-structure fabrication having a length of polysilicon thereon for forming said channel, comprises:

determining whether said prescribed channel length divided by two (L/2) is less than said polysilicon length of said half-structure, and if so, removing the excess of said polysilicon length;

mirroring said half-structure to form a full structure; and determining whether said polysilicon length on said full structure is less than said prescribed channel length, and if so, enlarging said polysilicon length to said prescribed channel length.

7. Apparatus for modeling a semiconductor transistor structure to optimize fabrication process parameters needed in achieving desired electrical properties for said structure, the apparatus comprising:

a fabrication process input deck defined for use in simulating a half-structure of said semiconductor transistor;

process parameter inputs defined for at least one process parameter of said fabrication process;

channel length inputs defined for said fabrication process;

a device input deck defined for use in simulating at least one electrical property of said structure;

means for simulating fabrications of said half-structure utilizing said defined process input deck and defined process parameter inputs;

means for expanding in separate computations said half-structure fabrications to full structure fabrications of prescribed channel lengths utilizing said channel length inputs; and means for simulating said at least one electrical property of said full structure fabrications utilizing said defined device input deck, thereby constructing a model of said transistor structure fabrications that correlates said process parameters with said at least one electrical property.

8. The apparatus of claim 7 further comprising means for generating an output of said model.

9. The apparatus of claim 8 wherein said output comprises a graphical display.

10. The apparatus of claim 9 wherein said graphical display comprises a three dimensional plot of said at least one electrical property for a selected one of said prescribed channel lengths versus two selected ones of said process parameter inputs.

11. The apparatus of claim 7 further comprising process control equipment in a semiconductor manufacturing line set responsive to said model to thereby fabricate said transistor structures according to said correlated process parameters and at least one electrical property.

12. Apparatus for modeling a semiconductor transistor structure to optimize fabrication process parameters needed in achieving desired electrical properties for said structure, the apparatus comprising:

a fabrication process input deck defined for use in simulating only one half of said structure;

process parameter inputs defined for at least one process parameter of said fabrication process;

channel length inputs defined for said fabrication process;

a device input deck defined for use in simulating at least one electrical property of said structure;

means for simulating fabrications of said half-structure utilizing said defined process input deck and defined process parameter inputs;

means for expanding said half-structure fabrications to full structure fabrications of prescribed channel lengths utilizing said channel length inputs; and means for simulating said at least one electrical property of said full structure fabrications utilizing said defined device input deck, thereby constructing a model of said transistor structure fabrications that correlates said process parameters with said at least one electrical property wherein said means for expanding of said half-structure fabrications, for each said half-structure fabrication having a length of polysilicon thereon for forming said channel, comprises:

means for determining whether said prescribed channel length divided by two (L/2) is less than said polysilicon length of said half-structure, and if so, removing the excess of said polysilicon length;

means for mirroring said half-structure to form a full structure; and means for determining whether said polysilicon length on said full structure is less than said prescribed channel length, and if so, enlarging said polysilicon length to said prescribed channel length.

13. Apparatus for modeling a semiconductor transistor structure to optimize fabrication process parameters needed in achieving desired electrical properties for said structure, the apparatus comprising:

a process simulator for simulating fabrications of a half-structure of said semiconductor transistor utilizing a fabrication process input deck defined for use in simulating said half-structure and process parameter inputs defined for at least one process parameter of said fabrication process;

a channel length selector for expanding in separate computations said half-structure fabrications to full structure fabrications of prescribed channel lengths utilizing channel length inputs defined for said fabrication process; and a device simulator for simulating at least one electrical property of said full structure fabrications utilizing a device input deck defined for use in simulating said at least one electrical property, thereby constructing a model of said transistor structure fabrications that correlates said process parameters with said at least one electrical property.

14. The apparatus of claim 13 further comprising means for generating an output of said model.

15. The apparatus of claim 14 wherein said output comprises a graphical display.

16. The apparatus of claim 15 wherein said graphical display comprises a three dimensional plot of said at least one electrical property for a selected one of said prescribed channel lengths versus two selected ones of said process parameter inputs.

17. The apparatus of claim 13 further comprising process control equipment in a semiconductor manufacturing line set responsive to said model to thereby fabricate said transistor structures according to said correlated process parameters and at least one electrical property.

18. Apparatus for modeling a semiconductor transistor structure to optimize fabrication process parameters needed in achieving desired electrical properties for said structure, the apparatus comprising:

a process simulator for simulating fabrications of only one half of said structure utilizing a fabrication process input deck defined for use in simulating said half-structure and process parameter inputs defined for at least one process parameter of said fabrication process;

a channel lenath selector for expanding said half-structure fabrications to full structure fabrications of prescribed channel lengths utilizing channel length inputs defined for said fabrication process; and a device simulator for simulating at least one electrical property of said full structure fabrications utilizing a device input deck defined for use in simulating said at least one electrical property, thereby constructing a model of said transistor structure fabrications that correlates said process parameters with said at least one electrical property wherein said channel length selector for expanding of said half-structure fabrications, for each said half-structure fabrication having a length of polysilicon thereon for forming said channel, comprises:

instructions for determining whether said prescribed channel length divided by two (L/2) is less than said polysilicon length of said half-structure, and if so, removing the excess of said polysilicon length;

instructions for mirroring said half-structure to form a full structure; and instructions for determining whether said polysilicon length on said full structure is less than said prescribed channel length, and if so, enlarging said polysilicon length to said prescribed channel length.

19. A method for improving the modeling efficiency of a semiconductor transistor structure simulator, the method comprising:

defining a half-structure of said semiconductor transistor;

defining a process input deck for said half-structure;

defining process parameter inputs for at least one process parameter of said fabrication process;

expanding in separate computations half-structure fabrications simulated using said process input deck and said process parameter inputs to full structure fabrications of prescribed channel lengths utilizing channel length inputs defined for said fabrication process; and simulating at least one electrical property of said full structure fabrications to construct a model of said transistor structure fabrications that correlates said process parameters with said at least one electrical property.

20. A method for improving the modeling efficiency of a semiconductor transistor structure simulator, the method comprising:

defining a process input deck for only one half of said structure;

defining process parameter inputs for at least one process parameter of said fabrication process;

expanding half-structure fabrications simulated using said process input deck and said process parameter inputs to full structure fabrications of prescribed channel lengths utilizing channel length inputs defined for said fabrication process; and simulating at least one electrical property of said full structure fabrications to construct a model of said transistor structure fabrications that correlates said process parameters with said at least one electrical property wherein said expanding comprises, for each said half-structure fabrication having a length of polysilicon thereon for forming said channel, determining whether said prescribed channel length divided by two (L/2) is less than said polysilicon length of said half-structure, and if so, removing the excess of said polysilicon length; mirroring said half-structure to form a full structure; and determining whether said polysilicon length on said full structure is less than said prescribed channel length, and if so, enlarging said polysilicon length to said prescribed channel length.

* * * * *